US010053810B2

(12) United States Patent
Heo et al.

(10) Patent No.: US 10,053,810 B2
(45) Date of Patent: Aug. 21, 2018

(54) LAUNDRY TREATMENT APPARATUS AND DOOR THEREOF

(71) Applicant: LG ELECTRONICS INC., Seoul (KR)

(72) Inventors: Seonil Heo, Seoul (KR); Kihyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 313 days.

(21) Appl. No.: 14/988,164

(22) Filed: Jan. 5, 2016

(65) Prior Publication Data

US 2016/0194802 A1 Jul. 7, 2016

(30) Foreign Application Priority Data

Jan. 5, 2015 (KR) ........................ 10-2015-0000734

(51) Int. Cl.
*H05K 7/02* (2006.01)
*D06F 37/28* (2006.01)
(Continued)

(52) U.S. Cl.
CPC .............. *D06F 37/28* (2013.01); *D06F 37/30* (2013.01); *D06F 39/14* (2013.01); *F26B 11/04* (2013.01);
(Continued)

(58) Field of Classification Search
CPC .......... D06F 37/28; D06F 37/30; D06F 39/14; F26B 23/04
(Continued)

(56) References Cited

U.S. PATENT DOCUMENTS 4,340,991 A * 7/1982 Gidseg .................... E05D 5/046 16/254
5,545,061 A * 8/1996 Sawayanagi ......... H01R 13/743 439/556
(Continued)

FOREIGN PATENT DOCUMENTS

CN 103166326 6/2013
GB 2 081 858 2/1982
(Continued)

OTHER PUBLICATIONS

European Search Report dated May 5, 2016 issued in Application No. 16150228.1.
(Continued)

*Primary Examiner* — Jayprakash N Gandhi
*Assistant Examiner* — Rhadames J Alonzo Miller
(74) *Attorney, Agent, or Firm* — KED & Associates, LLP

(57) ABSTRACT

The laundry treatment apparatus may include a cabinet providing an accommodation space, a drum rotatably provided inside the cabinet, a front cover unit provided on a portion of a front surface of the cabinet and having a cover hole provided to enable introduction and discharge of laundry into the drum, and a door assembly provided on the front cover unit so as to open or close the cover hole. The door assembly includes a hinge unit having one side separably coupled to the front cover unit and a remaining side separably coupled to the door assembly, so as to rotate the door assembly, and a handle unit separably coupled to the door assembly. The hinge unit and the handle unit are separably coupled to the door assembly by exchanging positions thereof.

6 Claims, 6 Drawing Sheets

(51) Int. Cl.

| | |
|---|---|
| ***D06F 39/14*** | (2006.01) |
| ***D06F 37/30*** | (2006.01) |
| ***F26B 11/04*** | (2006.01) |
| ***F26B 23/04*** | (2006.01) |
| ***F26B 25/08*** | (2006.01) |
| ***F26B 25/14*** | (2006.01) |
| *D06F 39/12* | (2006.01) |

(52) U.S. Cl.
CPC .............. *F26B 23/04* (2013.01); *F26B 25/08* (2013.01); *F26B 25/14* (2013.01); *D06F 39/12* (2013.01)

(58) Field of Classification Search
USPC ........................................................... 174/541
See application file for complete search history.

(56) References Cited

U.S. PATENT DOCUMENTS

| | | | | | |
|---|---|---|---|---|---|
| 5,941,619 | A * | 8/1999 | Stieben | E05D 11/0081 | 16/223 |
| 7,494,418 | B2 * | 2/2009 | Rifkin | G07F 17/32 | 463/46 |
| 7,980,088 | B2 * | 7/2011 | LeClear | H01R 31/06 | 62/331 |
| 8,299,656 | B2 * | 10/2012 | Allard | F25D 17/042 | 307/139 |
| 2006/0223351 | A1 * | 10/2006 | Kim | F25D 23/064 | 439/157 |
| 2008/0096407 | A1 * | 4/2008 | Lee | H01R 13/62911 | 439/153 |
| 2008/0166915 | A1 * | 7/2008 | Kendall | H01R 27/02 | 439/527 |
| 2008/0172838 | A1 * | 7/2008 | Choi | E05D 15/505 | 16/366 |
| 2008/0271290 | A1 * | 11/2008 | Chen | E05D 7/04 | 16/238 |
| 2008/0271291 | A1 * | 11/2008 | Chen | E05D 7/0407 | 16/238 |
| 2010/0077803 | A1 * | 4/2010 | Lim | D06F 37/28 | 68/212 |
| 2012/0083147 | A1 * | 4/2012 | Welch | H01R 25/162 | 439/215 |
| 2012/0161594 | A1 * | 6/2012 | Kim | D06F 39/14 | 312/228 |
| 2012/0187811 | A1 * | 7/2012 | Kim | E05D 3/10 | 312/228 |
| 2012/0242207 | A1 * | 9/2012 | Mershon | H01R 35/02 | 312/237 |
| 2012/0324675 | A1 * | 12/2012 | Huang | G06F 1/1681 | 16/319 |
| 2013/0139402 | A1 * | 6/2013 | Hong | D06F 58/04 | 34/427 |
| 2014/0150472 | A1 * | 6/2014 | Boarman | F25B 21/02 | 62/56 |
| 2015/0194749 | A1 * | 7/2015 | Kim | H01R 9/16 | 312/404 |

FOREIGN PATENT DOCUMENTS

| | | | |
|---|---|---|---|
| GB | 2081858 A * | 2/1982 | D06F 37/42 |
| KR | 10-1998-086233 | 12/1998 | |
| KR | 10-2000-0073299 | 12/2000 | |
| KR | 10-2004-0006239 | 1/2004 | |
| KR | 10-2005-0102915 | 10/2005 | |
| KR | 10-2005-0102918 | 10/2005 | |
| KR | 10-2007-0065139 | 6/2007 | |
| KR | 10-2011-0012307 | 2/2011 | |
| WO | WO 2005/042891 | 5/2005 | |
| WO | WO 2013/087774 | 6/2013 | |
| WO | WO 2014/191260 | 12/2014 | |

OTHER PUBLICATIONS

Chinese Office Action dated Jul. 5, 2017 issued in Application No. 201610282472.X (with English translation).

* cited by examiner (a)

(b)

(a)

(b)

(a)

(b)

LAUNDRY TREATMENT APPARATUS AND DOOR THEREOF

CROSS-REFERENCE TO RELATED APPLICATION

This application claims priority under 35 U.S.C. § 119 to Korean Patent Application No. 10-2015-0000734, filed on Jan. 5, 2015, whose entire disclosure is hereby incorporated by reference.

BACKGROUND

1. Field

The present disclosure relates to a laundry treatment apparatus and a door thereof.

2. Background

A laundry treatment apparatus includes a washing apparatus for washing laundry, or a drying apparatus for performing drying or post-treatment of laundry that has been washed in a washing apparatus. In both cases where a laundry treatment apparatus is embodied as a washing apparatus and where a laundry treatment apparatus is embodied as a drying apparatus, the laundry treatment apparatus requires an opening for the introduction of laundry thereinto. With regard to the process of treating the laundry introduced into the laundry treatment apparatus, the laundry treatment apparatus requires a door that cuts off the interior of the laundry treatment apparatus from the outside.

A laundry treatment apparatus and a door thereof have been provided with a handle assembly at the right side of the door to enable the opening of the door and provided with a hinge assembly at the left side of the door to enable the pivoting of the door when the user views the laundry treatment apparatus from the front side thereof because the user generally uses their right hand. However, in a case where the user is not a right-handed person, but a left-handed person, the user has experienced difficulty in opening or closing the door. In addition, even if exchanging the positions of the handle assembly and the hinge assembly provided at the door is possible, general users suffer from complicated works and inconvenience.

BRIEF DESCRIPTION OF THE DRAWINGS

The embodiments will be described in detail with reference to the following drawings in which like reference numerals refer to like elements wherein.

DETAILED DESCRIPTION

Figure 1:
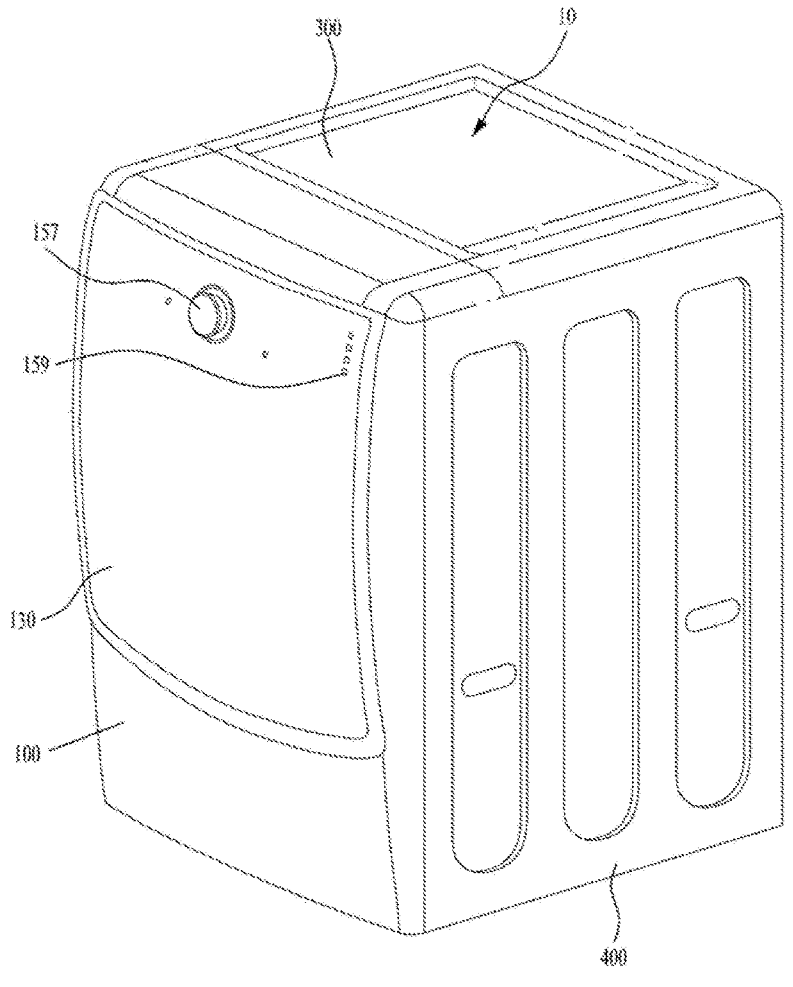
FIG. 1 is a view illustrating a laundry treatment apparatus according to the present disclosure.

Referring to FIG. 1, the laundry treatment apparatus according to the present disclosure includes a cabinet 10 defining an external appearance, a drum rotatably provided inside the cabinet 10 to accommodate laundry therein, a front cover unit 100 provided on the front surface of the cabinet 10, a top cover unit 300 provided on the top surface of the cabinet 10, and a side cover unit 400 provided on the side of the cabinet 10. In a case where the laundry treatment apparatus is used as a washing machine, the laundry treatment apparatus may further include a tub, which is provided inside the cabinet 10 and is configured to accommodate wash water therein.

The front cover unit 100 may further include a door assembly 130 provided to enable the introduction and discharge of laundry. The door assembly 130 may include a knob 157, which receives a command to operate the laundry treatment apparatus of the present disclosure from a user, and an LED unit 159, which displays the operating cycles of the laundry treatment apparatus in response to the operating command input from the user.

The door assembly 130 may include a hinge unit or assembly (140, see FIG. 3) provided on one side surface thereof so that the door assembly 130 may be opened or closed about the hinge unit 140 as the rotation axis thereof, and may further include a handle unit or assembly (150, see FIG. 3) provided on the side surface thereof, which is opposite to the hinge unit 140, in order to assist the user in opening or closing the door 130.

The door assembly 130 may cause inconvenience when the user opens or closes the door assembly 130 because the hinge unit 140 and the handle unit 150 are fixed in position. Therefore, the present disclosure proposes that positions of the hinge unit 140 and the handle unit 150 provided at the door assembly 130 are exchangeable. A method of exchanging the positions of the hinge unit 140 and the handle unit 150 and configurations thereof will be described later.

Figure 2:
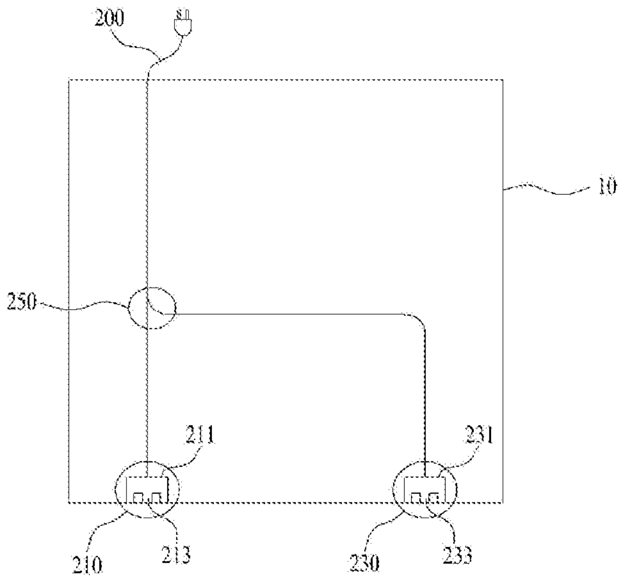
FIG. 2 is a view illustrating a power cable and a connector inside the laundry treatment apparatus according to the present disclosure.
Figure 2:
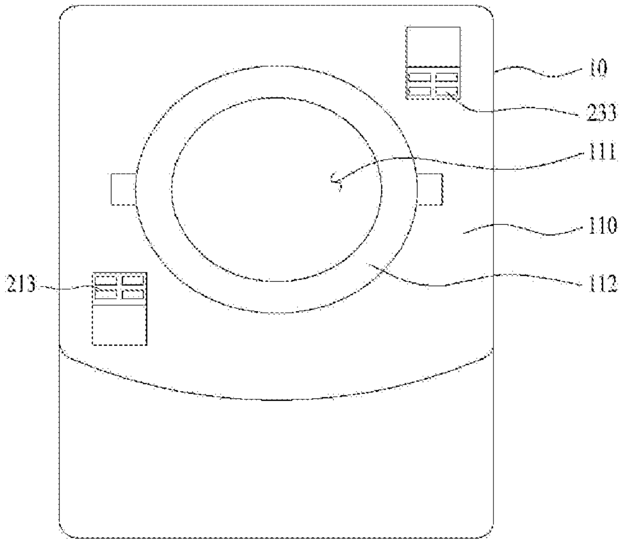

FIG. 2 is a view illustrating a power cable and a connector inside the laundry treatment apparatus according to the present disclosure. FIG. 2(*a*) illustrates the power cable 200 to supply power to the door assembly 130. The power cable 200 serves to receive power from an external source and to supply the power to the door assembly 130.

The power cable 200 may include a first power cable 210 to supply power to a first female part or terminal 213, a second power cable 230 to supply power to a second female part or terminal 233, and a branch part or splitter 250, at which the power supplied from the external source branches off to the first power cable 210 and to the second power cable 230.

The first power cable 210 may include a first body 211 and the first female part 213 coupled to a male part or terminal 163 (see FIG. 5) provided at the harness connector 160 or the hinge unit 140. The second power cable 230 may include a second body 231 and the second female part 233 coupled to the male part or terminal 163 provided at the harness connector 160 or the hinge unit 140.

FIG. 2(*b*) is a front view illustrating the power cable 200 provided at the cabinet 10. A front cover body 110 may include a cover hole or an opening 111 to enable the introduction and discharge of laundry, and a cover groove 112 indented to accommodate a gasket, which protrudes from the door assembly 130 and serves to prevent wash water from overflowing out of the cover hole 111.

The first power cable 210 may be provided at the left lower end of the front cover body 110, and the second power cable 230 may be provided at the right upper end of the front cover body 110. The drawings merely illustrate an embodiment of the present disclosure, and positions of the first power cable 210 and the second power cable 230 are not limited to the left lower end and the right upper end, and may be selected from somewhere of the front cover body 110 as needed.

Figure 3:
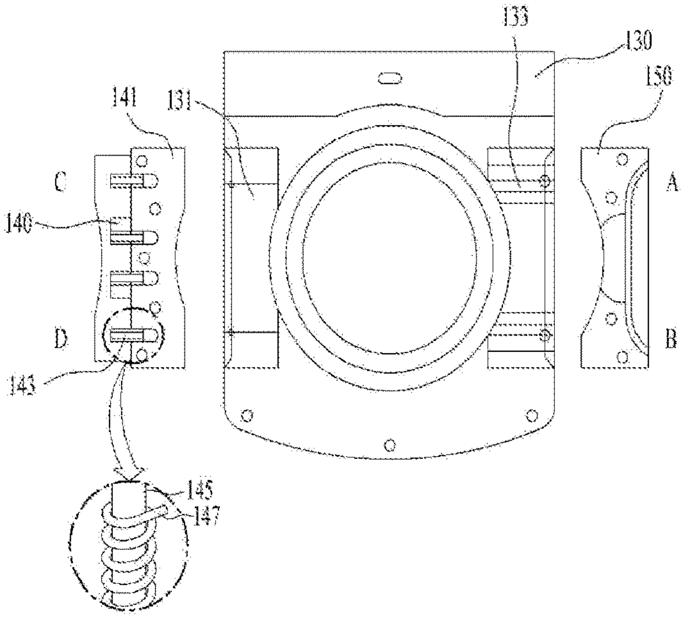
FIG. 3 is a view illustrating a door of the laundry treatment apparatus according to the present disclosure.
Figure 3:
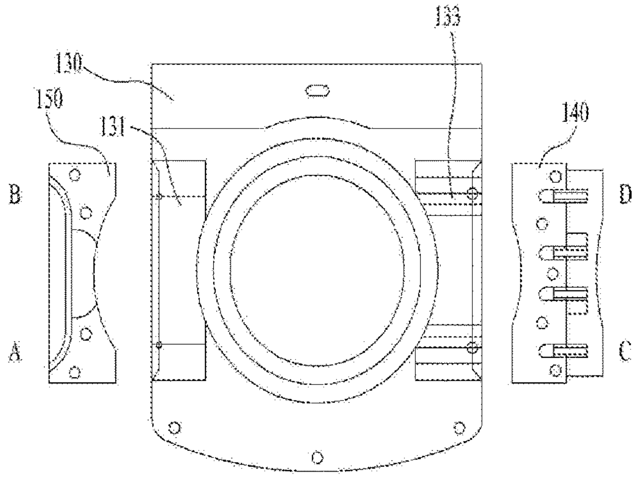

FIG. 3 is a view illustrating a door of the laundry treatment apparatus according to the present disclosure. FIG. 3(*a*) illustrates the state before positions of the hinge unit 140 and the handle unit 150 are exchanged, and FIG. 3(*b*) illustrates the state after positions of the hinge unit 140 and the handle unit 150 are exchanged. The exchange of positions of the hinge unit 140 and the handle unit 150 provided at the door assembly 130 will be described below with reference to FIGS. 3(*a*) and 3(*b*).

The door assembly 130 may include a hinge coupling portion or coupler 131 coupled to the hinge unit 140, a handle coupling portion or coupler 133 coupled to the handle unit 150, and a door connector provided inside the door assembly 130 to receive power from the power cable 200. Although the coupling configuration of the door connector in relation to the door assembly 130 has not been illustrated in detail in the drawings of the present disclosure, the door connector may be sufficient so long as it receives power from the power cable 200 and transmits the power to the door assembly 130.

When the user views the door assembly 130 from the front side thereof, the handle unit 150 may be provided at the right side and the hinge unit 140 may be provided at the left side, before positions of the hinge unit 140 and the handle unit 150 are exchanged.

For convenience, both distal ends of the handle unit 150 are designated by A and B, and both distal ends of the hinge unit 140 are designated by C and D. The hinge unit 140 may include a hinge body 141 having one surface coupled to the door assembly 130 and the other surface provided on the front cover body 110 to enable the pivoting of the door assembly 130, a protrusion 143 protruding from the hinge body 141, a hinge shaft 145 provided on the protrusion 143, and a spring 147 provided on the hinge shaft 145 so as to provide elastic force required to allow the door assembly 130 to return to an original state thereof after the door assembly 130 performs pivoting. The spring 147 may be a torsional spring surrounding the outer circumferential surface of the hinge shaft 145.

The hinge unit 140 and the handle unit 150 are separably coupled to the door assembly 130. Therefore, the hinge unit 140 and the handle unit 150 may be separated from the door assembly 130. When rotating the separated handle unit 150 and hinge unit 140 counterclockwise on the basis of the center of the door assembly 130, as exemplarily illustrated in FIG. 3(*b*), the handle 150 may come to the left side of the door assembly 130 and the hinge unit 140 may come to the right side of the door assembly 130.

At this time, the handle unit 150 and the hinge unit 140 may come to be inverted up and down. Comparing with the state before positions of the handle unit 150 and the hinge unit 140 are exchanged, the handle unit 150 and the hinge unit 140 may have a point reflection shape about the center of the door assembly 130 as the symmetrical center.

Figure 4:
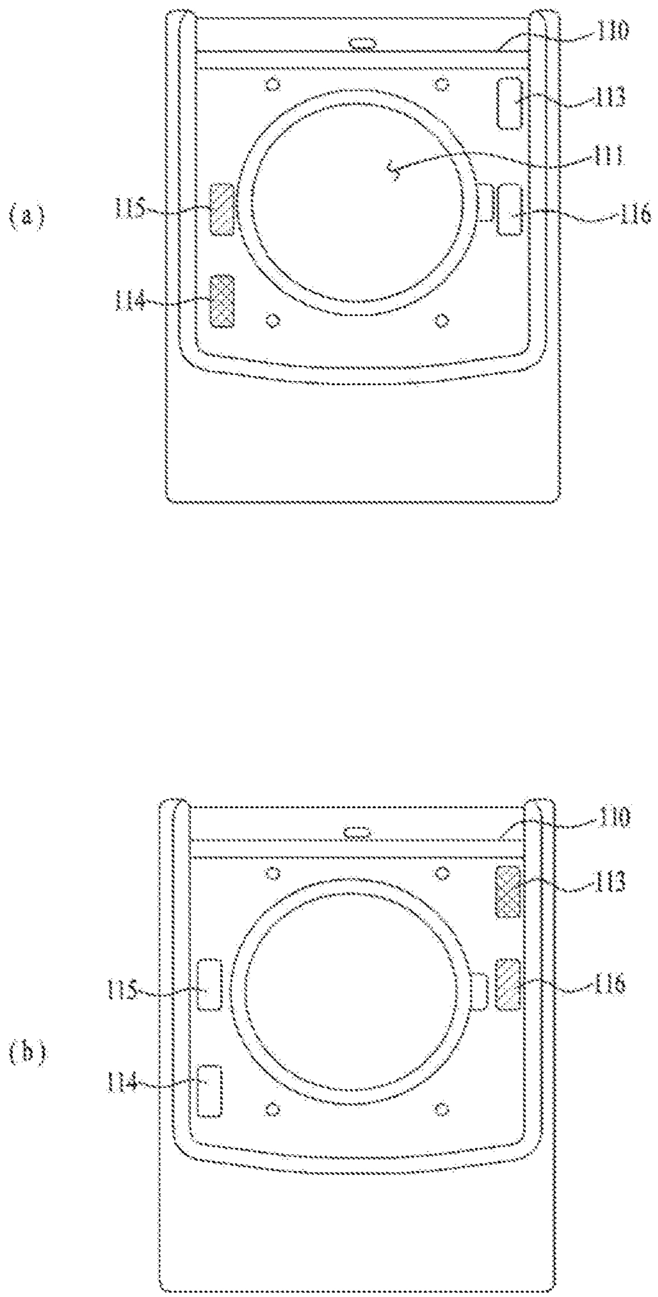
FIG. 4 is a view illustrating a front cover unit of the laundry treatment apparatus according to the present disclosure.

FIG. 4 is a view illustrating the front cover unit of the laundry treatment apparatus according to the present disclosure. The front cover unit 100 may include the front cover body 110, the cover hole 111 formed in the front cover body 110 to enable the introduction and discharge of laundry, a first hinge coupling portion 113 and a second hinge coupling portion 114, which are provided respectively on different surfaces of the front cover body 110 for the coupling of the first hinge unit 140, and a first latch coupler or coupling portion 115 and a second latch coupler or coupling portion 116, which are provided respectively on different surfaces of the front cover body 110 for the coupling of a latch mechanism (not illustrated).

FIG. 4(*a*) illustrates the front cover body 110 in a case where the hinge unit 140 of the door assembly 130 is coupled at the right side of the front cover body 110 when the user views the front cover body 110 from the front side thereof, and FIG. 4(*b*) illustrates the front cover body 110 in a case where the hinge unit 140 of the door assembly 130 is coupled to the left side of the front cover body 110 when the user views the front cover body 110 from the front side thereof.

When attempting to exchange positions of the hinge unit 140 and the handle unit 150 of the door assembly 130, the structure of the first hinge coupling portion 113, the second hinge coupling portion 114, the first latch coupling portion 115, and the second latch coupling portion 116 of the front cover body 110 must be changed because the positions of the hinge unit 140 and the handle unit 150 of the door assembly 130 are changed. A change in the structure of the first hinge coupling portion 113, the second hinge coupling portion 114, the first latch coupling portion 115, and the second latch coupling portion 116 of the front cover body 110 due to change in the structure of the door assembly 130 will be described.

As illustrated in FIG. 4(*a*), in a case where the hinge unit 140 of the door assembly 130 is coupled at the right side of the front cover body 110 when the user views the front cover body 110 from the front side thereof, the first hinge coupling portion 113 and the second latch coupling portion 116 may be opened because the hinge unit 140 of the door assembly 130 may be provided so as to be connected to the first hinge coupling portion 113 and the second latch coupling portion 116. In addition, the second hinge coupling portion 114 and the first latch coupling portion 115, which are not coupled to the door assembly 130, may be closed. In order to close the second hinge coupling portion 114 and the first latch coupling portion 115, the second hinge coupling portion 114 may be provided with the harness connector (160, see FIG. 5), which is separably coupled to the first hinge coupling portion 113 and the second hinge coupling portion 114, and the first latch coupling portion 115 may be provided with the latch mechanism (not illustrated), which is separably coupled to the first latch coupling portion 115 and the second latch coupling portion 116.

Accordingly, it must be allowed for the user to change the structure of the front cover body 110 from the state illustrated in FIG. 4(*a*) to the state illustrated in FIG. 4(*b*), in order to enable that the coupling position of the hinge unit 140 of the door assembly 130 is changed from the right side to the left side when the user views the front cover body 110 from the front side thereof.

In order to couple the hinge unit 140 of the door assembly 130 to the first latch coupling portion 115 and the second hinge coupling portion 114, the user may remove the harness connector (160, see FIG. 5) and the latch mechanism (not illustrated) which have closed the second hinge coupling portion 114 and the first latch coupling portion 115.

The removed harness connector 160 may be coupled to the first hinge coupling portion 113 so as to close the first hinge coupling portion 113, and the removed latch mechanism (not illustrated) may be coupled to the second latch coupling portion 116 so as to close the second latch coupling portion 116. The latch mechanism (not illustrated) and the harness connector 160 may be provided such that coupling positions thereof are changeable in a point reflection manner about the center of the cover hole 111 as the symmetrical center. The harness connector of the laundry treatment apparatus according to the present disclosure. The harness connector 160 may include a body 161 and the male part 163 protruding from the body 161 so as to be coupled to the door connector. The harness connector 160 is provided to close one of the hinge coupling portions 113 and 114 in a case where the hinge unit 140 of the door assembly 130 is not coupled to the hinge coupling portion 113 or 114 of the front cover body 110, and thus may function as a so-called dummy connector.

Figure 5:
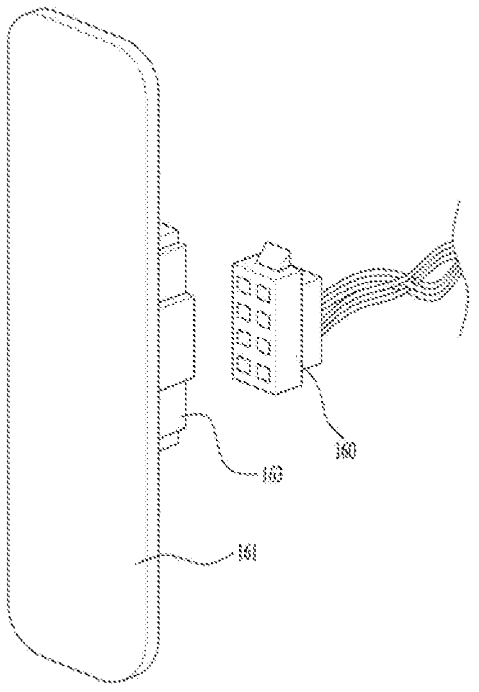
FIG. 5 is a view illustrating a harness connector of the laundry treatment apparatus according to the present disclosure.

Through provision of the harness connector 160, the user may protect the door connector from external shocks. The male part 163 and the door connector may be provided to implement connector coupling that is generally used in the art of the present disclosure. A detailed description related to the connector coupling is omitted herein. Accordingly, although FIG. 5 illustrates that the harness connector 160 has the male part 163 and the door connector has the female part, this embodiment is given by way of example and the disclosure is not limited thereto. As needed, the harness connector 160 may have the female part, and the door connector may have the male part.

Figure 6:
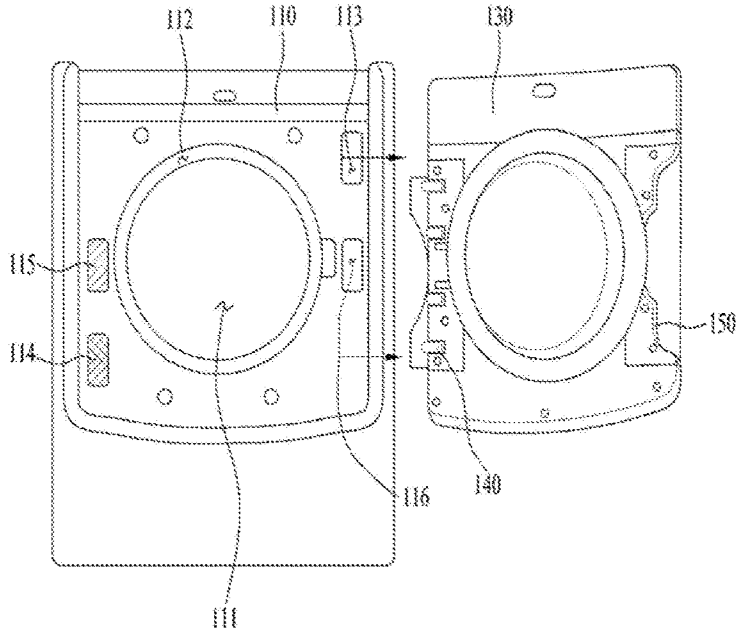
FIG. 6 is a view illustrating the coupling relationship between the door and the front cover unit of the laundry treatment apparatus according to the present disclosure.
Figure 6:
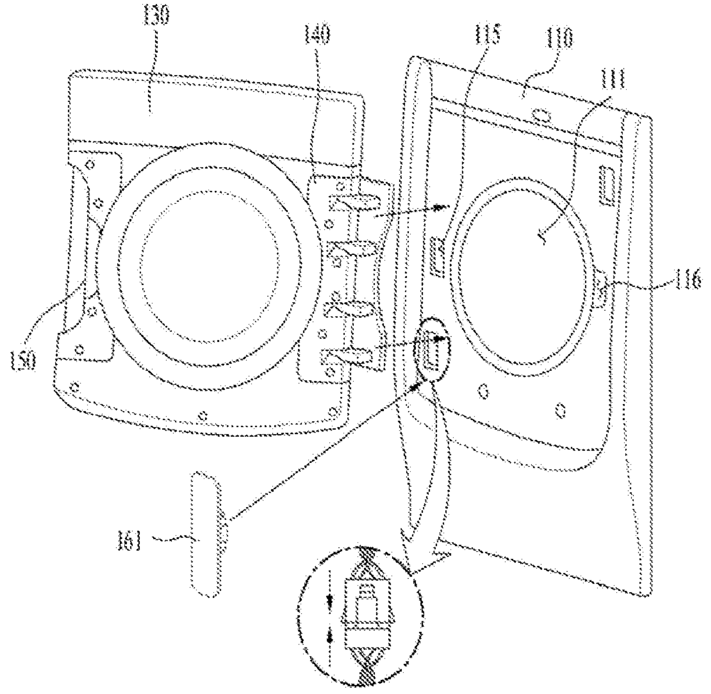

FIG. 6 is a view illustrating the coupling relationship between the door and the front cover unit of the laundry treatment apparatus according to the present disclosure. The coupling of the door assembly 130 and the front cover body 110 of the laundry treatment apparatus according to the present disclosure will be described with reference to FIG. 6. The following description is based on the state in which the door assembly 130 is mounted at the right side of the front cover body 110 when the user views the front cover body 110 from the front side thereof.

The door assembly 130 may be disassembled from the front cover body 110. As described above with reference to FIG. 3, the user may change the position of the hinge unit 140 of the door assembly 130 by exchanging the positions of the hinge unit 140 and the handle unit 150 of the door assembly 130. Subsequently, the user disassembles the harness connector 160 and the latch mechanism (not illustrated), which are separably coupled to the first latch coupling portion 115 and the second hinge coupling portion 114 of the front cover body 110, and thereafter couples the harness connector 160 and the latch mechanism (not illustrated) to the second latch coupling portion 116 and the first hinge coupling portion 113.

The hinge unit 140 of the door assembly 110 is located at the left side when the user views the front cover body 110 from the front side thereof. Thus, the hinge unit 140 may be coupled to the first latch coupling portion 115 and the second hinge coupling portion 114 of the front cover body 110. At this time, in order to receive power from the first power cable 210 provided at the second hinge coupling portion 114, the hinge unit 140 may implement connector coupling with the first female part 213 provided in the first power cable 210. Although not illustrated in the drawings, in a case where the hinge unit 140 and the hinge coupling portions 113 and 114 do not have the same size, a separate cap may be provided.

In conclusion, through the above-described procedure, the configuration in which the hinge unit 140 is mounted at the right side of the front cover body 110 such that the user opens or closes the door assembly 130 with their left hand may be changed to the configuration in which the hinge unit 140 is mounted at the left side of the front cover body 110 such that the user opens or closes the door assembly 130 with their right hand.

The present disclosure may provide a laundry treatment apparatus and a door thereof, in which positions of a hinge assembly and a handle assembly provided at the door are exchangeable, in order to ensure that the user conveniently opens or closes the door.

A laundry treatment apparatus and a door thereof, allows a user to more conveniently exchange positions of a hinge assembly and a handle assembly provided at the door.

A laundry treatment apparatus and a door thereof, include a hinge assembly and a handle assembly provided at the door that are exchangeable, in order to ensure that the user conveniently opens or closes the door.

A laundry treatment apparatus and a door thereof, allow a user to more conveniently exchange positions of a hinge assembly and a handle assembly provided at the door.

A laundry treatment apparatus may include a cabinet providing an accommodation space, a drum rotatably provided inside the cabinet, a front cover unit provided on a portion of a front surface of the cabinet and having a cover hole provided to enable introduction and discharge of a laundry object into the drum, and a door assembly provided on the front cover unit so as to open or close the cover hole, wherein the door assembly includes a hinge unit having one side separably coupled to the front cover unit and a remaining side separably coupled to the door assembly, so as to rotate the door assembly, and a handle unit separably coupled to the door assembly, the handle unit being adapted to allow the door assembly to be separable from the front cover unit, and wherein the hinge unit and the handle unit are separably coupled to the door assembly by exchanging positions thereof.

In addition, the hinge unit and the handle unit have a point reflection shape.

In addition, the laundry treatment apparatus may further include a power cable configured to receive power from an external source, and the power cable may include a first power cable provided so as to be connected to one side of the front cover unit, a second power cable provided so as to be connected to a remaining side of the front cover unit, and a branch part, at which the power, supplied to the power cable from the external source, branches off to the first power cable and to the second power cable.

The door assembly may further include a door connector connected to at least one of the first power cable or the second power cable so as to transmit the power received from the external source to the door assembly.

The laundry treatment apparatus may further include a harness connector connected to at least one of the first power cable or the second power cable, which is not connected to the door connector.

The laundry treatment apparatus may further include a latch mechanism provided on the front cover unit so as to restrain the handle unit.

The latch mechanism may be separably provided on the front cover unit so as to be located at a position corresponding to the handle unit.

Any reference in this specification to “one embodiment,” “an embodiment,” “example embodiment,” etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A laundry treatment apparatus comprising:

a cabinet;

a drum rotatably provided inside the cabinet;

a front cover provided over a front surface of the cabinet and having an opening; and a door assembly provided over the front cover so as to open or close the opening, wherein the door assembly includes:

a hinge unit having one side separably coupled to the front cover and a remaining side separably coupled to the door assembly so as to rotate the door assembly;

a handle unit separably coupled to the door assembly, the handle unit being adapted to allow the door assembly to be separable from the front cover; and a power cable configured to receive power from an external source, wherein the hinge unit and the handle unit are separably coupled to the door assembly by exchanging positions thereof, and wherein the cable includes:

a first power cable provided so as to be connected to one side of the front cover;

a second power cable provided so as to be connected to a remaining side of the front cover; and a splitter, at which the power, supplied to the cable from the external source, branches off to the first power cable and to the second power cable.

2. The apparatus according to claim 1, wherein the hinge unit and the handle unit have a point reflection shape.

3. The apparatus according to claim 1, wherein the door assembly further includes a door connector connected to at least one of the first cable or the second power cable so as to transmit the power received from the external source to the door assembly.

4. The apparatus according to claim 3, further comprising a harness connector connected to at least one of the first power cable or the second power cable, which is not connected to the door connector.

5. The apparatus according to claim 1, further comprising a latch mechanism provided on the front cover unit so as to restrain the handle unit.

6. The apparatus according to claim 5, wherein the latch mechanism is separably provided on the front cover unit so as to be located at a position corresponding to the handle unit.

* * * * *